(12) United States Patent
Bae et al.

(10) Patent No.: US 8,248,873 B2
(45) Date of Patent: Aug. 21, 2012

(54) SEMICONDUCTOR MEMORY DEVICE WITH HIGH-SPEED DATA TRANSMISSION CAPABILITY, SYSTEM HAVING THE SAME, AND METHOD FOR OPERATING THE SAME

(75) Inventors: Ji-Hyae Bae, Kyoungki-do (KR); Sang-Sik Yoon, Kyoungki-do (KR); Ki-Chang Kwean, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 1069 days.

(21) Appl. No.: 12/215,511

(22) Filed: Jun. 26, 2008

(65) Prior Publication Data

US 2009/0119419 A1 May 7, 2009

(30) Foreign Application Priority Data

Nov. 2, 2007 (KR) .................. 10-2007-0111565

(51) Int. Cl.
*G11C 29/00* (2006.01)
*G11C 7/00* (2006.01)

(52) U.S. Cl. .................. 365/201; 713/500; 713/503

(58) Field of Classification Search ...... 710/4; 713/500, 713/503; 365/191, 198, 201, 233.1
See application file for complete search history.

(56) References Cited

U.S. PATENT DOCUMENTS 6,845,050 B2 * 1/2005 Lee ................................ 365/194
7,206,239 B2 * 4/2007 Kikuchi et al. ............... 365/201

FOREIGN PATENT DOCUMENTS

KR 10-2005-0020141 A 3/2005
* cited by examiner

*Primary Examiner* — VanThu Nguyen
(74) *Attorney, Agent, or Firm* — Blakely, Sokoloff, Taylor & Zafman

(57) ABSTRACT

Semiconductor memory device with high-speed data transmission capability, system having the same includes a plurality of address input circuits and a plurality of data output circuits and a training driver configured to distribute address information input through the plurality of address input circuits together with a data loading signal for a read training, and generate data training patterns to be output through the plurality of data output circuits.

17 Claims, 12 Drawing Sheets

SEMICONDUCTOR MEMORY DEVICE WITH HIGH-SPEED DATA TRANSMISSION CAPABILITY, SYSTEM HAVING THE SAME, AND METHOD FOR OPERATING THE SAME

CROSS-REFERENCE TO RELATED APPLICATIONS

The present invention claims priority of Korean patent application number 10-2007-0111565, filed on Nov. 2, 2007, which is incorporated by reference in its entirety.

BACKGROUND OF THE INVENTION

The present invention relates to a high-speed semiconductor memory device, and more particularly, to an apparatus and method for transmitting and receiving data at a high speed in a read operation and a write operation.

In a system with a variety of semiconductor devices, a semiconductor memory device serves as a data storage. The semiconductor memory device outputs data corresponding to addresses received from a data processor, e.g., a central processing unit (CPU), or stores data received from the data processor into memory cells selected by addresses.

As the operating speed of the system increases and semiconductor integrated circuit technologies are advanced, semiconductor memory devices are required to input and output data at higher speed. In order for faster and stable operation of semiconductor memory devices, a variety of circuits inside the semiconductor memory devices must be able to operate at a high speed and transfer signals or data between the circuits at a high speed.

In practice, the operation of the semiconductor memory device is delayed by a control circuit, a data line, and a connecting apparatus, which are used to read data from unit cells or transfer external data to unit cells. In addition, delay occurs when data output from the semiconductor memory device is transferred to devices requiring the data. In a high-speed system, delay occurring in the signal or data transfer may degrade the system performance and lower the operational stability and reliability. Delay occurring in a data transfer path is highly likely to change according to a given operation environment, which will have an adverse effect on the operation of the semiconductor memory device.

Generally, an operational performance of the semiconductor memory device is further improved as a read operation of outputting data from a unit cell after receiving an external command becomes faster. In particular, a time required to output data is a very important performance index in a semiconductor memory device used for processing a large amount of data such as images at a high speed. Furthermore, the system can operate stably when data output from the semiconductor memory device are exactly transferred to a variety of processors.

FIG. 1 is a timing diagram illustrating a read operation of a conventional semiconductor memory device. Specifically, FIG. 1 illustrates an operation of receiving and transmitting data between a semiconductor memory device for graphics and a graphics processing unit (GPU).

Referring to FIG. 1, in a read operation, a typical double data rate (DDR) memory device outputs required data DRAM_DATA in synchronization with rising and falling edges of a memory clock DRAM_CLOCK according to a request of a GPU. In addition, the GPU reads data values input in synchronization with rising and falling edges of the GPU clock GPU_CLK. In this case, the GPU can exactly receive data when the rising and falling edges of the graphic clock GPU_CLK exist in a valid window of data output from the DDR memory device.

In transferring data, a data delay time of t2-t1 occurs due to physical factors between the DDR memory device and the GPU. The DDR memory device outputs data in synchronization with the edges of the clock, but the GPU can exactly receive the data when the edges of the clock are positioned within the valid window, preferably at the center of the valid window. Therefore, a most ideal phase difference between the memory clock DRAM_CLOCK and the graphic clock GPU_CLK is 0.5×UI (where UI represents the valid data window). In this case, a data delay time is about t2−t1+0.5×UI, considering physical factors existing between the DDR memory device and the GPU. Consequently, as illustrated in FIG. 1, the DDR memory device and the GPU operate in synchronization with clocks having different phases. The different clock environment of the DDR memory device and the GPU means that the data being transferred is mismatched with a clock for recognizing the data, that is, a data trigger signal.

In order to solve the mismatch and provide a stable operation, the DDR memory device or the system including the same predefines a delay time occurring between the semiconductor memory device and the GPU. To this end, the DDR memory device or the system uses separate clocks, that is, reference signals, such as a read strobe signal (RDQS) and a write strobe signal (WDQS). Also, an output access time (tAC) and a data strobe signal output access time (tDQSCK) based on the reference clock, or a time (tDQSQ) from the data strobe signal to the data output are specified in the specification of the semiconductor memory device.

Parameters or related information defined in the specification of the semiconductor memory device are physically fixed inside the semiconductor memory device and the GPU. Therefore, it is difficult to ensure a normal data transfer when unexpected operation environment changes occur within a real system. In particular, since the valid data window of a high-speed system becomes narrower, it is not easy to transfer data stably as data increases in a channel between the semiconductor memory device and the GPU.

To solve this problem, the semiconductor memory device and the GPU cope with the high-speed data transfer through data training. The data training refers to a technique that adjusts a skew between data by using a known data pattern between the semiconductor memory device and a controller for stably transferring data for the read and write operations. As one example, a specification describing the performance of a DDR version 3 (DDR3) memory device adopts a write leveling technique for compensating a time difference between a clock (HCLK) and a data strobe signal (DQS) due to delay. Programmable delay components are used in the data strobe signal, so that timing requirements including tDQSS, tDSS and tDSH of the semiconductor memory device can be satisfied by compensating the skew between the strobe signal and the clock through the write leveling.

Recent semiconductor memory devices for graphics have been designed to transfer data at a rate of 4 Gbps. In order to ensure the reliability of the high-speed operation, the data training is specified in the specification of the semiconductor memory devices for graphics.

SUMMARY OF THE INVENTION

Embodiments of the present invention are directed to providing a semiconductor memory device, which is capable of ensuring the reliability of a read operation and improving the reliability of high-speed data transmission by outputting different data training patterns through address information input from a data processor together with a read training command.

In accordance with an aspect of the present invention, there is provided a plurality of address input circuits and a plurality of data output circuits and a training driver configured to distribute address information input through the plurality of address input circuits together with a data loading signal for a read training, and generate data training patterns to be output through the plurality of data output circuits.

DESCRIPTION OF SPECIFIC EMBODIMENTS

Hereinafter, a semiconductor memory device with high-speed data transmission capability, a system having the same, a method for operating the same in accordance with the present invention will be described in detail with reference to the accompanying drawings.

Figure 1:
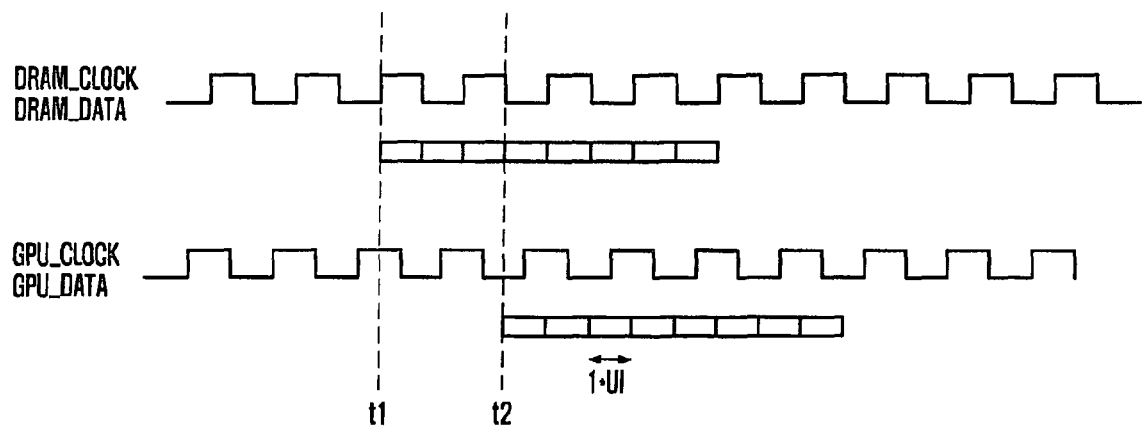
FIG. 1 is a timing diagram illustrating a read operation of a conventional semiconductor memory device.
Figure 2:
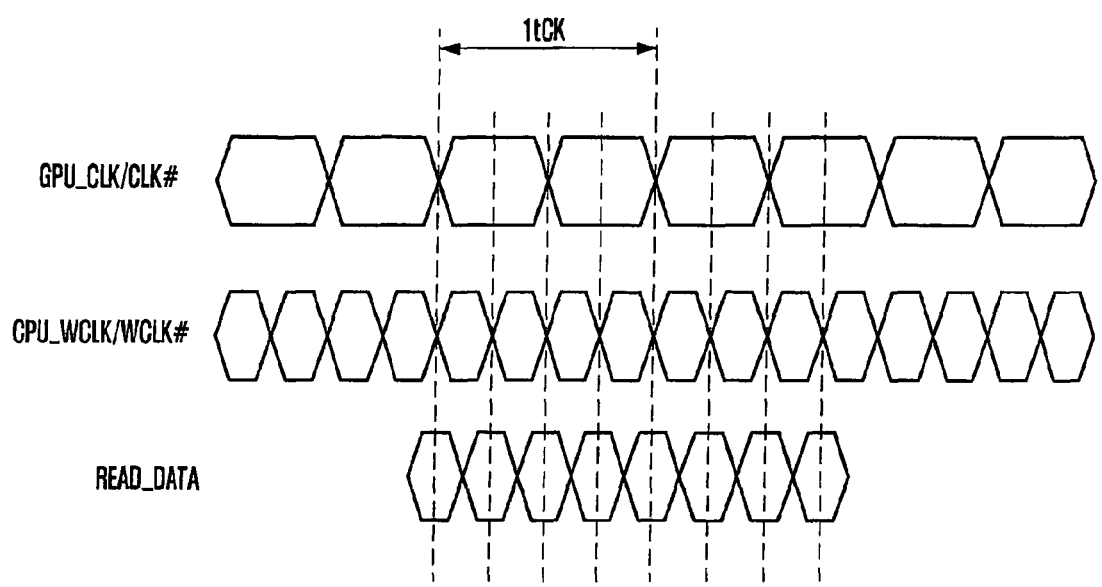
FIG. 2 is a timing diagram illustrating data input/output operations of a high-speed semiconductor memory device.

FIG. 2 is a timing diagram illustrating data input/output operations of a high-speed semiconductor memory device.

Referring to FIG. 2, a semiconductor memory device and a system including the same use two clocks having different frequencies. A graphics processing unit (GPU), one of data processors, receives data D0 to D7 from the semiconductor memory device in synchronization with rising and falling edges of the data clocks WCLK and WCLK#. The data clocks WCLK and WCLK# have two times the frequency of system clocks CLK and CLK#. The data clocks WCLK and WCLK# are used as a reference for data transfer, and the system clocks CLK and CLK# are used as a reference for command and address transfer.

The following description will be made about a quad data rate (QDR) memory device that inputs or outputs four data in one period (1 tCK) of the system clocks CLK and CLK#. The QDR memory device can transfer data at a rate of 4 Gbps, which is four times faster than that of the system clocks CLK and CLK# having a period of 1 ns.

In both the semiconductor memory device and the GPU, the rising and falling edges of the data clocks WCLK and WCLK# must exist within the valid window of the transferred data. Compared with the related art, the valid data window becomes narrower due to the data clocks WCLK and WCLK# having two times the frequency of the system clocks CLK and CLK#. Since the data can be normally transferred when the rising and falling edges of the data clocks WCLK and WCLK# are positioned within the valid data window, an operation margin in the data transfer becomes 0.25×tCK, which is identical to the size of the valid window. Consequently, it becomes difficult for the GPU to receive data as the frequency of the system clocks CLK and CLK# is increasing. In order to ensure the high-speed operation of the semiconductor memory device and the data processor, the semiconductor memory device in accordance with an embodiment of the present invention performs a data training, such as a read training and a write training.

Figure 3:
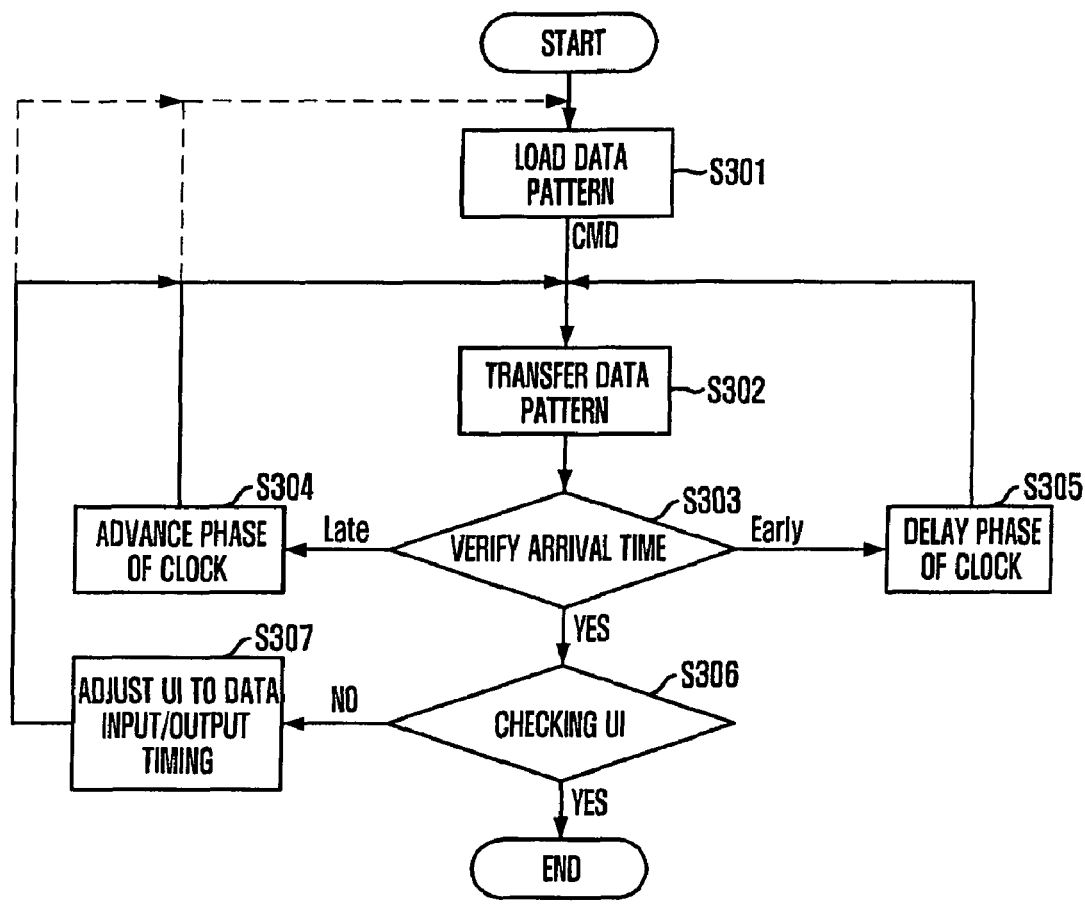
FIG. 3 is a flowchart illustrating a read training of a semiconductor memory device in accordance with an embodiment of the present invention.

FIG. 3 is a flowchart illustrating a read training of a semiconductor memory device in accordance with an embodiment of the present invention.

Referring to FIG. 3, the read training performed between the semiconductor memory device and the data processor includes operation S301 of loading a data pattern, operation S302 of transferring the data pattern, operation S303 of checking an arrival time of the data pattern, operations S304 and S305 of advancing or delaying phase of data clock, operation S306 of determining if an interface corresponds to data input/output timing after adjusting the phase of the data clock with respect to the arrival time of the data pattern, and operation S307 of adjusting the interface (UI) when the interface (UI) does not correspond to the data input/output timing. The operation S301 of loading the data pattern and the operation S302 of transferring the data pattern are performed by the semiconductor memory device, and the other operations S303 to S307 are performed by the data processor.

After the data pattern for the read training is loaded inside the semiconductor memory device, the data processor outputs a command for transferring the data pattern to the semiconductor memory device. The data processor checks the arrival time of the data pattern and compares the valid window of the data pattern with the rising and falling edges of the data clocks WCLK and WCLK#. The data processor advances the phase of the data clocks WCLK and WCLK# when the phase of the data clocks WCLK and WCLK# lags behind the arrival time of the data pattern, and delays the phase of the data clocks WCLK and WCLK# when the phase of the data clocks WCLK and WCLK# leads the arrival time of the data pattern. In addition, the interface (UI) of the data processor checks the operation margin at the arrival time of the data pattern transferred from the semiconductor memory device. If the operation margin is not adequate, the data processor adjusts the interface (UI) according to the input/output timing of the data pattern and re-checks the data pattern. A method for generating the data training pattern loaded for the read training in the semiconductor memory device will be described later.

Figure 4:
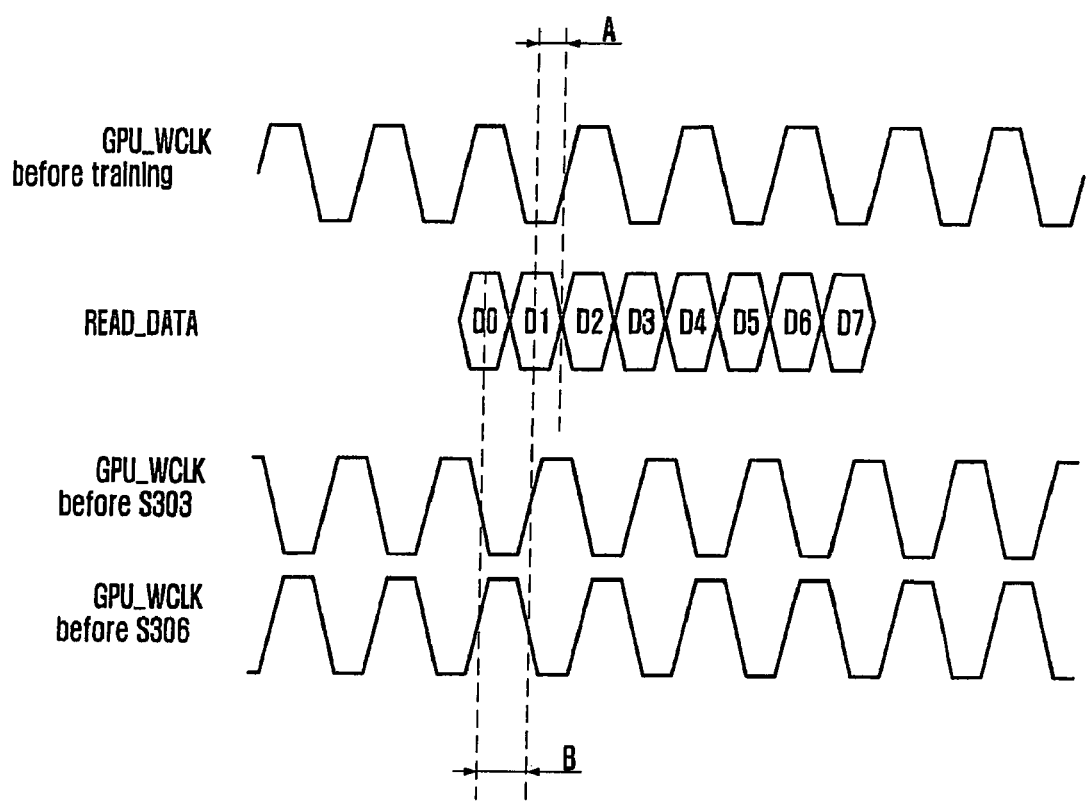
FIG. 4 is a timing diagram illustrating the result of the read training of FIG. 3.

FIG. 4 is a timing diagram illustrating the result of the read training of FIG. 3.

Referring to FIG. 4, the rising or falling edges of the data clock WCLK before the read training are not positioned within the valid window of the data patterns D0-D7 as well as the center of the valid window of the data patterns D0-D7. A time difference from the center of the valid window of the data pattern to the rising edge of the current data clock WCLK is indicated by a reference symbol "A". In this case, the data processor cannot stably receive the data patterns D0-D7.

In operation S303 of FIG. 3, the read training starts and the data processor adjusts the phase of the data clock WCLK by the time difference A so that the rising edge of the data clock WCLK can be positioned at the center of the valid window of the data patterns D0-D7. In operations S306 and S307, the phase of the data clock WCLK is also re-adjusted according to the interface (UI) of the data processor. The phase of the data clock WCLK is re-adjusted because the interface (UI) is designed such that the data processor receives the first data from the semiconductor memory device in synchronization with the rising edge of the data clock WCLK. If the edge of the data clock WCLK is positioned at the center of the valid window of the data patterns D0-D7 and matched with the interface (UI) of the data processor, the phase of the data clock WCLK need not be re-adjusted. As illustrated in FIG. 4, if the phase of the data clock WCLK is adjusted to match with the interface (UI) of the data processor, the falling edge of the first data pattern D0 is positioned at the center of the valid window of the second data pattern D1. Therefore, the data processor can sequentially receive the data patterns D0 to D7 at half period intervals "B" of the data clock WCLK.

In order to perform the above-described read training, the semiconductor memory device must transfer the data training patterns to the data processor. The semiconductor memory device outputs the data training patterns through a plurality of data input/output pads. At this point, the same or different data training patterns may be output through the data input/output pads. The read training is to virtually transfer the data training patterns between the semiconductor memory device and the data processor by modeling the read operation of outputting data in response to the read command transferred from the data processor to the semiconductor memory device. The effect of the read training is great as it is more similar to the real circumstances. The following description will be made about a structure that can generate a variety of data training patterns to the data processor in the semiconductor memory device in accordance with an embodiment of the present invention.

Figure 5:
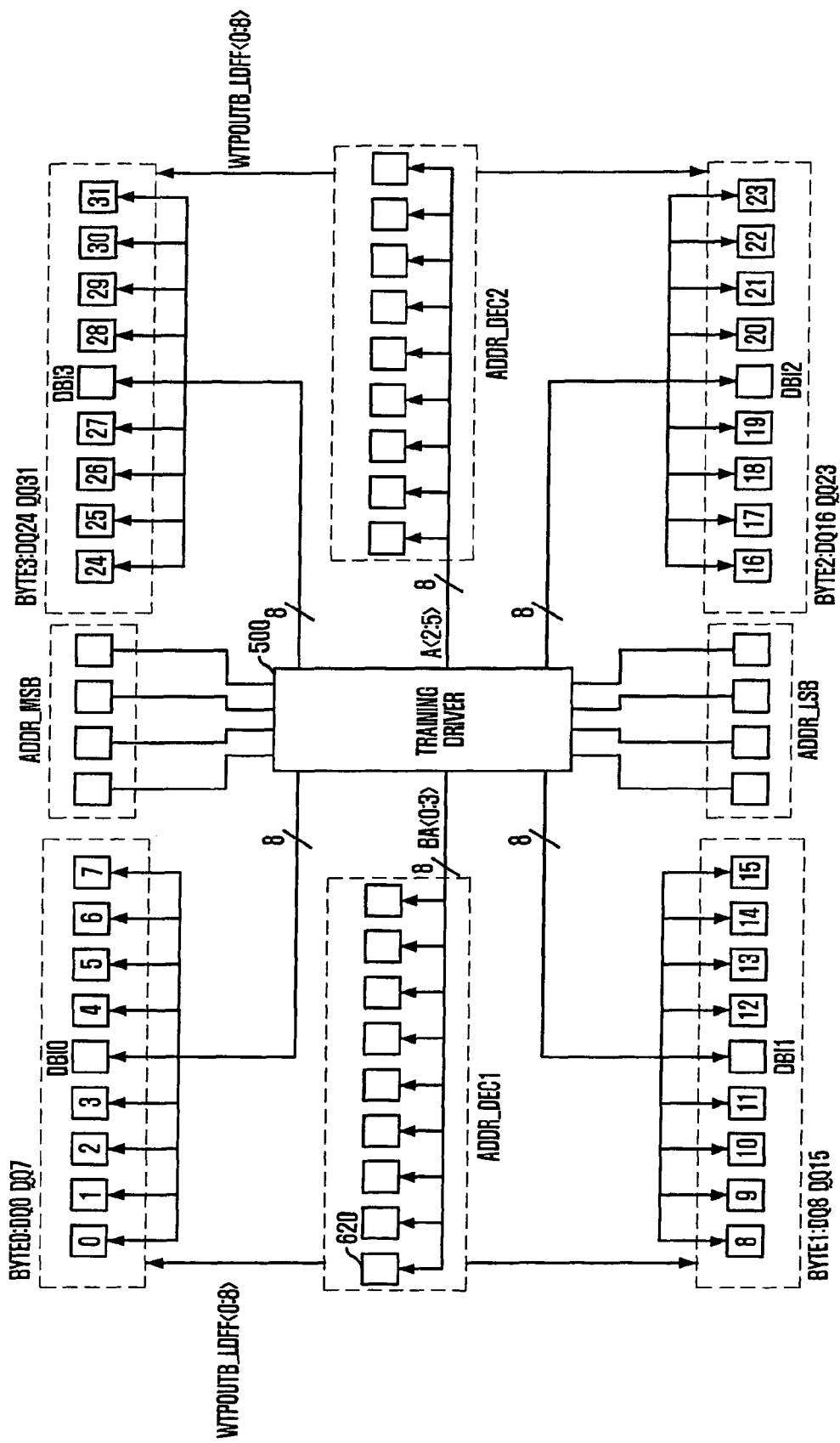
FIG. 5 is a block diagram of a semiconductor memory device in accordance with an embodiment of the present invention.

FIG. 5 is a block diagram of a semiconductor memory device in accordance with an embodiment of the present invention.

Referring to FIG. 5, the semiconductor memory device includes a plurality of address input circuits, a plurality of data output circuits BYTE0 to BYTE3, and training driver 500. The training driver 500 distributes address information A0-A11 and BA0-BA3 input together with a data loading signal for the read training through the plurality of address input circuits, and generates data training patterns through the plurality of data output circuits BYTE0 to BYTE3. The address information A0-A11 and BA0-BA3 includes data type address information for constructing the data training patterns, and control signal type address information for selecting the data output circuits to output the data type address information.

The semiconductor memory device includes a total of eight address input circuits receiving address information in synchronization with the rising and falling edges of the system clock. That is, since two pieces of information are input in one period of the system clock through each address input circuit, sixteen pieces of address information can be received in one period of the system clock through the eight address input circuits. In addition, the semiconductor memory device includes thirty-two data transfer circuits DQ0 to DQ31 and four data bus inversion circuits DBI0 to DBI3. The data bus inversion circuits DBI0 to DBI3 are used to indicate if the data transferred through the data transfer circuits DQ0 to DQ31 are inverted. In the normal operation, the data bus inversion circuits DBI0 to DBI3 output data inversion signals that are activated according to operation environment and preset conditions of the semiconductor memory device.

In addition, the semiconductor memory device further includes address decoder circuits ADDR_DEC1 and ADDR_DEC2 configured to output address decoding signals for selectively enabling the data output circuits to transfer the data type address information in response to the control signal type address information. The address decoder circuits ADDR_DEC1 and ADDR_DEC2 include a plurality of address decoders that respectively control the data transfer circuits DQ0 to DQ31 and the data bus inversion circuits DBI0 to DBI3.

Figure 6:
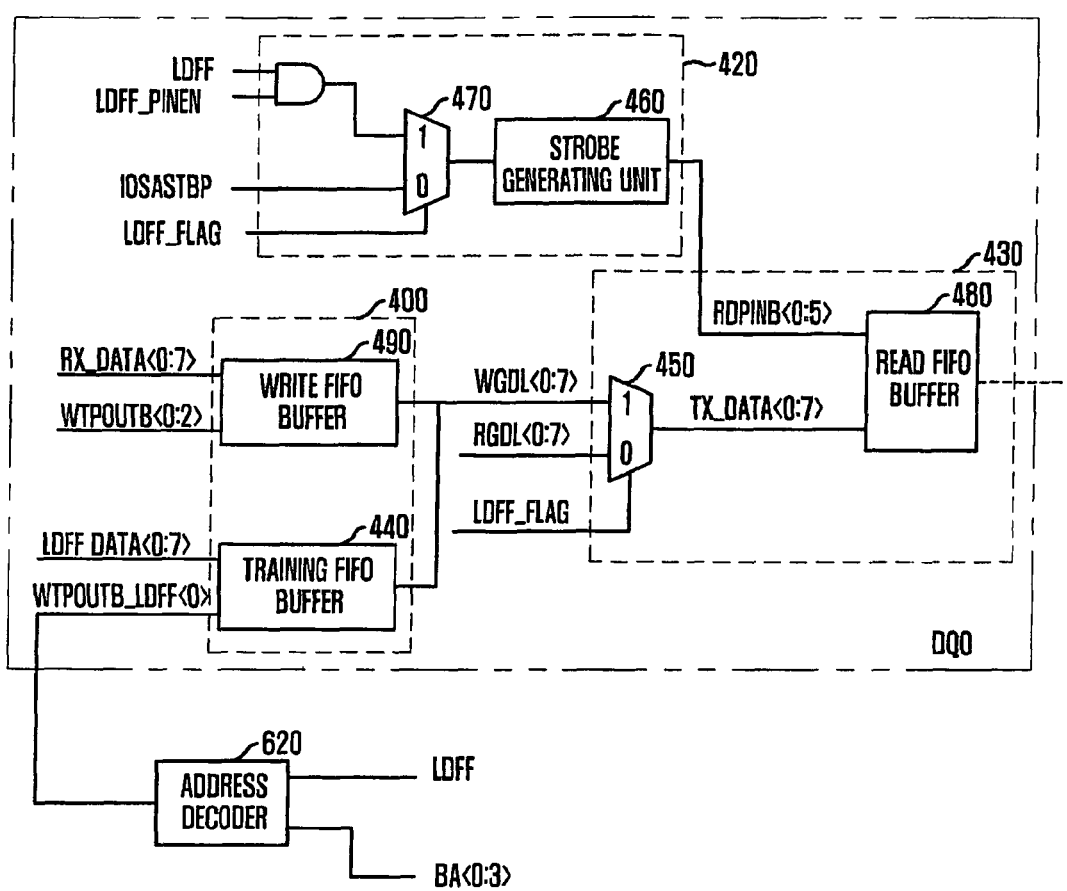
FIG. 6 is a block diagram of a data output circuit in the semiconductor memory device of FIG. 5.

FIG. 6 is a block diagram of the data output circuit in the semiconductor memory device of FIG. 5. It is assumed herein that the semiconductor memory device in accordance with the embodiment of the present invention is a DQR memory device having an eight-bit pre-fetch structure.

Referring to FIG. 6, the semiconductor memory device includes a first data transfer circuit DQ0 and an address decoder 620. Since the thirty-two data transfer circuits DQ0 to DQ31 and the four data bus inversion circuits DBI0 to DBI3 included in the plurality of data output circuits BYTE0 to BYTE3 have the same structures, detailed description thereof will be omitted. The first data transfer circuit DQ0 includes a first-in first-out (FIFO) buffer unit 400, a strobe signal generating unit 420, and a read FIFO unit 430. In addition, the address decoder 620 corresponds to the first data transfer circuit DQ0 among the plurality of address decoders included in the address decoder circuits ADDR_DEC1 and ADDR_DEC2.

The address decoder 620 decodes a data loading signal LDFF and band addresses BA<0:3> as the control signal type address information, and outputs an address decoding signal WTPOUTB_LDFF<0> for enabling the first data output circuit DQ0. The control signal type address information input to the address decoder 620 will be described later in detail with reference to FIG. 7.

A write FIFO buffer unit 400 included in the first data output circuit DQ0 receives data type address information LDFF_DATA<0:7> from the training driver 500 in response to the address decoding signal WTPOUTB_LDFF<0>, and transfers the received data type address information LDFF_DATA<0:7> to a write global data line WGDL. The strobe signal generating unit for controlling the read FIFO buffer unit 430 generates a strobe signal RDPINB when the input of the address information corresponding to the data loading signal LDFF is completed. The read FIFO buffer unit 430 receives the data type address information LDFF_DATA<0:7> transferred to the write global data line WGDL in response to the data loading signal LDFF and outputs the received address information to the outside of the semiconductor memory device in response to the strobe signal RDPINB.

The data loading signal LDFF is a command for loading the data training pattern onto the FIFO buffer unit in the read training, and a minimum spacing between the data loading signals LDFF is maintained at 4×tCK. This means that no commands are input but only the address information is input in three periods of the system clock prior to the input of a next loading signal after the data loading signal is activated. The control signal type address information is input during the first period of the system clock together with the data loading signal LDFF, and the data type address information is input during the second and third periods of the system clock. Since the address information is input at both the rising and falling edges of the system clock, a total of thirty-two pieces of information are input during two periods as the data type address information corresponding to the loading signal LDFF. In addition, the data loading signal LDFF applied from the outside is transferred to the data output circuits BYTE0 to BYTE3 and the address decoder circuits ADDR_DEC1 and ADDR_DEC2.

The data output circuits BYTE0 to BYTE3 will now be described in more detail. The write FIFO buffer unit 400 includes a write FIFO buffer 490 and a training FIFO buffer 440. The write FIFO buffer 490 transfers external data RX_DATA<0:2> to the write global data line WGDL in the write operation. The training FIFO buffer 440 transfers the data type address information LDFF_DATA<0:7> to the write global data line according to the address decoding signal WTPOUTB_LDFF<0>.

The strobe signal generating unit 420 includes a first logic unit, a first multiplexer 470, and a strobe generating unit 460. The first logic unit detects if the input of the address information corresponding to the data loading signal LDFF is completed. The first multiplexer 470 outputs one of an output of the first logic unit and a read pulse strobe IOSASTBP in response to the data loading signal LDFF. The strobe generating unit 460 generates a strobe signal RDPINB activated for a predetermined duration in response to the output of the first multiplexer 470.

The first logic unit is implemented with an AND gate. The first logic unit performs an AND operation on the data loading signal LDFF, which is activated to a logic low level, and the address input signal LDFF_PINEN, which indicates that the last address information is input through the data bus inversion circuit DBI, and outputs the result to the first multiplexer 470.

The first multiplexer 470 selects one of the outputs of the first logic unit and the read strobe pulse IOSASTBP in response to a data loading flag signal LDFF_FLAG. The read strobe pulse IOSASTBP is a control signal for transferring data output from the unit cell to the output terminal of the data output circuit in the read operation. The data loading flag signal LDFF_FLAG is a signal that is activated when the data loading signal LDFF is input after the read training starts. The first multiplexer 470 outputs the read strobe pulse IOSASTBP when the semiconductor memory device performs a normal read operation, and outputs the result of the first logic unit when the semiconductor memory device transfers data for the read training operation.

The strobe generating unit 460 generates the strobe signal RDPINB having a predetermined activation interval in response to the output of the first multiplexer 470. Consequently, the activation interval of the strobe signal RDPINB is determined according to the operation environment of the semiconductor memory device.

The read FIFO buffer unit 430 for outputting data transferred through the global data line to the outside in response to the strobe signal RDPINB includes a second multiplexer 450 and a read FIFO buffer 480. The second multiplexer 450 selects one of the write global data line WGDL and the read global data line RGDL in response to the data loading signal LDFF. The read FIFO buffer 480 outputs the data training patterns and data input from the second multiplexer 450 in response to the strobe signal RDPINB. Although the read FIFO buffer unit of the typical semiconductor memory device receives data from the unit cell through the read global data line RGDL and outputs the received data to the outside, the read FIFO buffer unit in accordance with the present invention may output the data training patterns transferred through the write global data line WGDL in order for the read training. Like the first multiplexer 470, the second multiplexer 450 outputs the data training patterns or the data transferred through the write global data line WGDL or the read global data line RGDL according to the data loading flag signal LDFF_FLAG activated in response to the data loading signal LDFF.

Figure 7A:
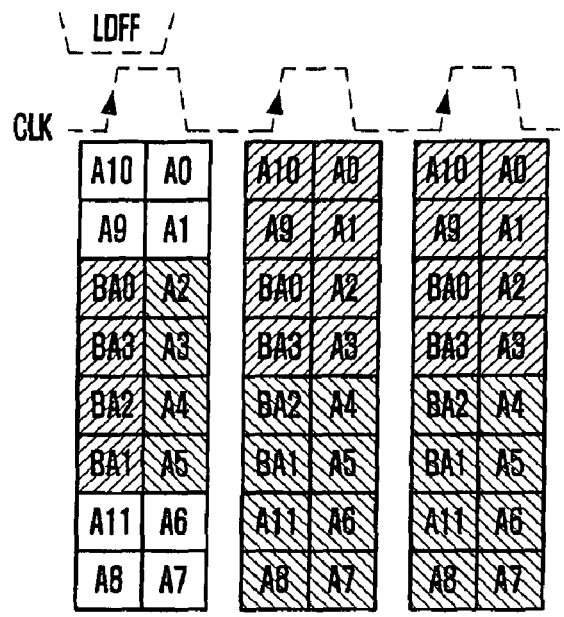
FIG. 7A is a conceptual diagram for explaining distribution of the address information in the read training of the semiconductor memory device of FIG. 5.
Figure 7B:
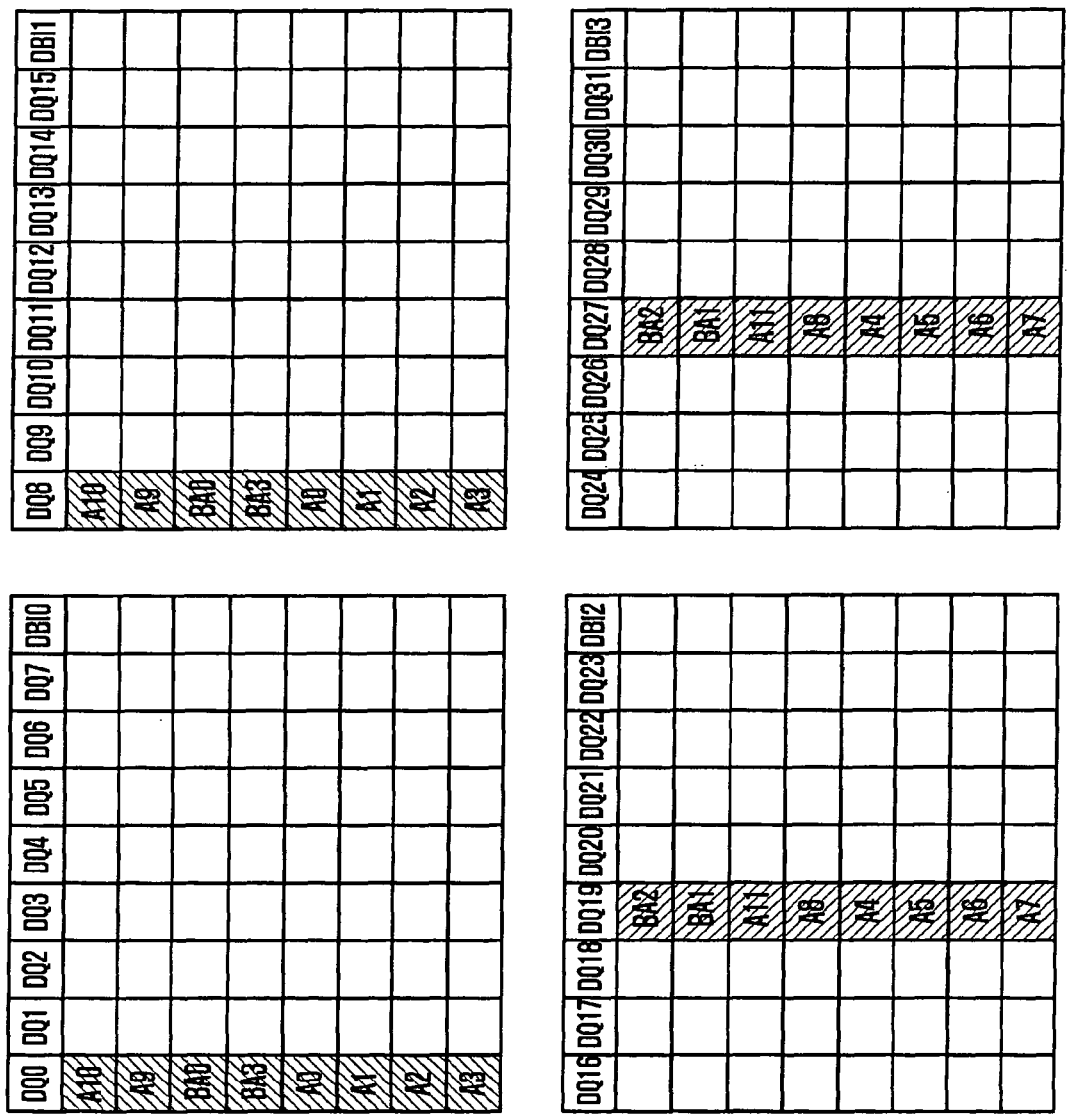
FIG. 7B is a conceptual diagram for explaining the distribution result when the address information of FIG. 7A is distributed to the data output circuits.

FIG. 7A is a conceptual diagram for explaining distribution of the address information in the read training of the semiconductor memory device of FIG. 5, and FIG. 7B is a conceptual diagram for explaining the distribution result when the address information of FIG. 7A is distributed to the data output circuits.

Referring to FIG. 7A, when the data loading signal LDFF is activated to a logic low level, the control signal type address information is input in response to the rising and falling edges of the system clock CLK. Thirty-two pieces of address information are input during next two periods of the system clock CLK. Only address information BA0-BA3 and A2-A5 among the address information input during the first period of the system clock CLK is used as the control signal type address information.

The bank address information BA0 to BA3, which is the control signal type address information input in synchronization with the rising edge of the system clock, is input to the first address decoder circuit ADDR_DEC1 of FIG. 5 and determines which of the data transfer circuits and the data bus inversion circuits included in the two data output circuits BYTE0 and BYTE1 is enabled. Eight pieces of address information input through the upper address pad ADDR_MSB during the second and third periods (rising and falling edges) of the system clock CLK are transferred to the enabled data transfer circuits or data bus inversion circuits included in the data output circuits.

That is, referring to FIGS. 7A and 7B, when the bank address information BA0 to BA3 input in response to the rising edge of the first period of the system clock CLK is "0000", the first data transfer circuit DQ0 and the ninth data transfer circuit DQ8 within the two data output circuits BYTE0 and BYTE1 are enabled. Then, the address information A10/A0, A9/A1, BA0/A2 and BA3/A3 input through the upper address pad ADDR_MSB in synchronization with the rising and falling edges of the second period of the system clock CLK are transferred to the first data transfer circuit DQ0. The address information A10/A0, A9/A1, BA0/A2 and BA3/A3 input through the upper address pad ADDR_MSB in synchronization with the rising and falling edges of the third period of the system clock CLK are transferred to the ninth data transfer circuit DQ8.

In addition, the control signal type address information A2 to A5 input through the lower address pad ADDR_LSB in synchronization with the falling edge of the first period of the system clock CLK are input to the second address decoder circuit ADDR_DEC2 of FIG. 5 and determine which of the data transfer circuits and the data bus inversion circuits included in two different data output circuits BYTE2 and BYTE3 is enabled. Eight pieces of address information input through the lower address pad ADDR_LSB during the second and third periods (rising and falling edges) of the system clock CLK are transferred to the enabled data transfer circuits or data bus inversion circuits included in the data output circuits.

Referring to FIGS. 7A and 7B, when the control signal type address information A2 to A5 input in response to the rising edge of the first period of the system clock CLK is "0110", the twentieth data transfer circuit DQ19 and the twenty-eighth data transfer circuit DQ27 within the two data output circuits BYTE2 and BYTE3 are enabled. Then, the address information BA2/A4, BA1/A5, A11/A6 and A8/A7 input through the lower address pad ADDR_LSB in synchronization with the rising and falling edges of the second period of the system clock CLK are transferred to the twentieth data transfer circuit DQ19. The address information BA2/A4, BA1/A5, A11/A6 and A8/A7 input through the lower address pad ADDR_LSB in synchronization with the rising and falling edges of the third period of the system clock CLK are transferred to the twenty-eighth data transfer circuit DQ27.

In the current embodiment of the present invention, the address information to be transferred to the data bus inversion circuits is transferred last, and the address input signal LDFF_PINEN of FIG. 5 activated when all address information input together with the data loading signal LDFF is activated may be generated using the control signal type address information activated when the address information is transferred to the data bus inversion circuits. Referring to FIG. 7A, in order to select the data bus inversion circuit, only specific address information BA1 and A5 is activated as "0001".

Through the above-described method, a time of 9×4×tCK is taken to fill the write FIFO buffers within all the data output circuits, and all address information is stored in the read FIFO buffer as the data training patterns through the write global data line WGDL when the corresponding strobe signal RDPINB) is activated. More specifically, when the data loading signal LDFF is activated once, the read training is performed through the four data transfer circuits. When the data loading signal LDFF is activated nine times, the data training patterns can be output through all the data output circuits. That is, since one-time data loading signal LDFF can allow the data training patterns to be applied to one data transfer circuit DQ per four data output circuits BYTE0 to BYTE3, the data training pattern can be applied to a total of four data transfer circuits for 4tCK. Among them, two data transfer circuits have the same control signal type address information. Since the respective data output circuits include eight data transfer circuits and one data bus inversion circuit, a time of 9×4×tCK is necessary to apply the data training patterns to all the data transfer circuits and the data bus inversion circuits.

In addition, the read training is selectively performed on a part of the data output circuits according to the operation environment, not on all the data transfer circuits DQ0 to DQ31 and the data bus inversion circuits DBI0 to DBI3 included in all the data output circuits BYTE0 to BYTE3. In this case, the data training patterns are generated by receiving and distributing only necessary address information and output through the corresponding data output circuits.

Figure 8:
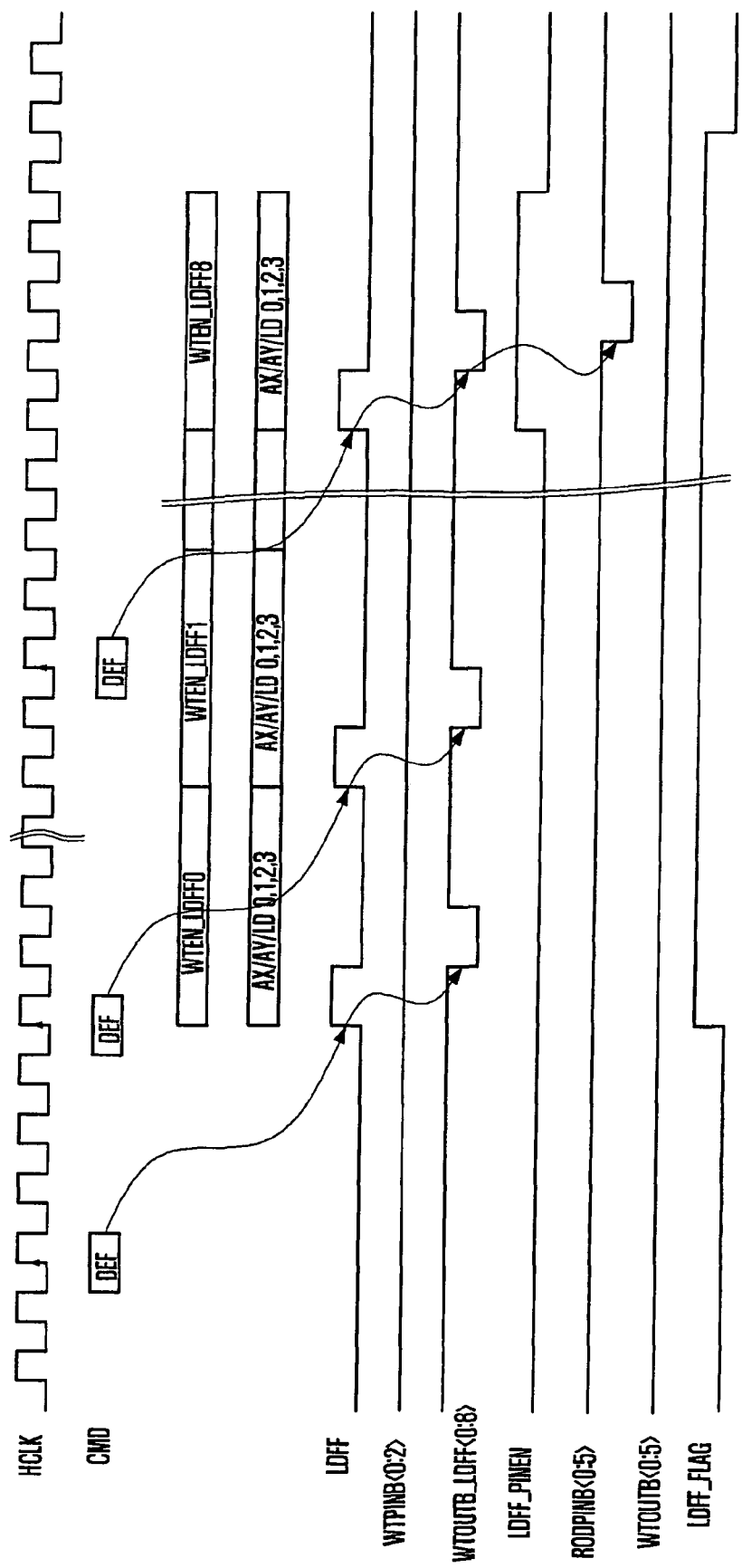
FIG. 8 is a timing diagram illustrating the operation of the semiconductor memory device of FIG. 5.

FIG. 8 is a timing diagram illustrating the operation of the semiconductor memory device of FIG. 5. Specifically, the read training performed on all the data output circuits will be described below.

Referring to FIG. 8, when a time corresponding to a write latency (WL) elapses after the data loading signal LDFF is applied, the data loading signal LDFF is transferred to the address decoder circuits ADDR_DEC1 and ADDR_DEC2 and the data output circuits BYTE0 to BYTE3. Then, the address decoding signal WTPOUTB_LDFF corresponding to the control signal type address information AX/AY is activated, and the data type address information LD0, LD1, LD2 and LD3 is transferred to the write FIFO buffer corresponding to the address decoding signal WTPOUTB_LDFF. When a time corresponding to the write latency (WL) elapses after the last ninth data loading signal is input, the address input signal LDFF_PINEN is activated in the interval WTEN_IDFF8 where the data loading signal is transferred to the address decoder circuits ADDR_DEC1 and ADDR_DEC2 and the data output circuits BYTE0 to BYTE3. When the strobe signal RDPINB is activated, the data training patterns input to the read FIFO buffer are output to the outside. While the data training patterns generated based on the address information are transferred from the write FIFO buffer to the read FIFO buffer through the write global data line WGDL, the data loading flag signal LDFF_FLAG corresponding to the data loading signal LDFF is in an activated state.

Figure 9:
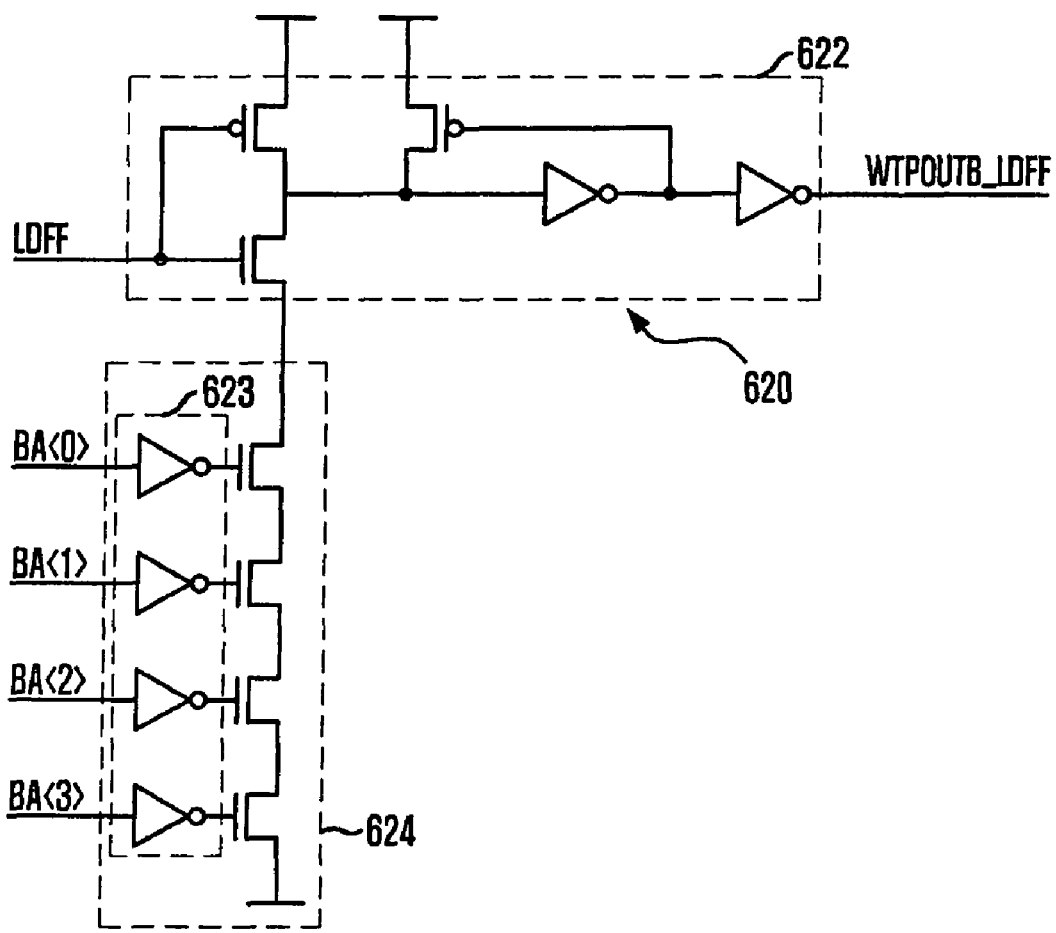
FIG. 9 is a circuit diagram of an address decoder of FIG. 6.

FIG. 9 is a circuit diagram of the address decoder 620 of FIG. 6.

Referring to FIG. 9, the address decoder 620 includes a reset unit 622 and an enable unit 624. The reset unit 622 disables all the data output circuits in response to the data loading signal LDFF, and the enable unit 624 enables the data output circuits corresponding to the control signal type address information BA<0:3>.

More specifically, the enable unit 622 includes a plurality of MOS transistors serially connected to transfer the logic low level, and a second logic unit 623 for enabling the MOS transistors in response to only the predefined control signal type address information. The reset unit 624 includes a first MOS transistor for transferring a logic high level when the data loading signal LDFF is activated, a second MOS transistor for transferring an output of the enable unit when the data loading signal LDFF is deactivated, and a latch for holding output levels of the first and second MOS transistors and outputting the address decoding signal WTPOUTB_LDFF.

When the address decoder 620 is configured to enable the first data transfer circuit DQ0, the second logic unit 623 includes inverters for inverting the respective control signal type address information because it must turn on a plurality of NMOS transistors in response to the control signal type address information BA<0:3> of "0000". The semiconductor memory device in accordance with the embodiment of the present invention may or may not include the inverters of the second logic units of the respective address decoders for activating the corresponding address decoding signal WTPOUTB_LDFF according to the control signal type address information for enabling the data transfer circuits and the data bus inversion circuits. Furthermore, the positions of the inverters may be changed.

Figure 10:
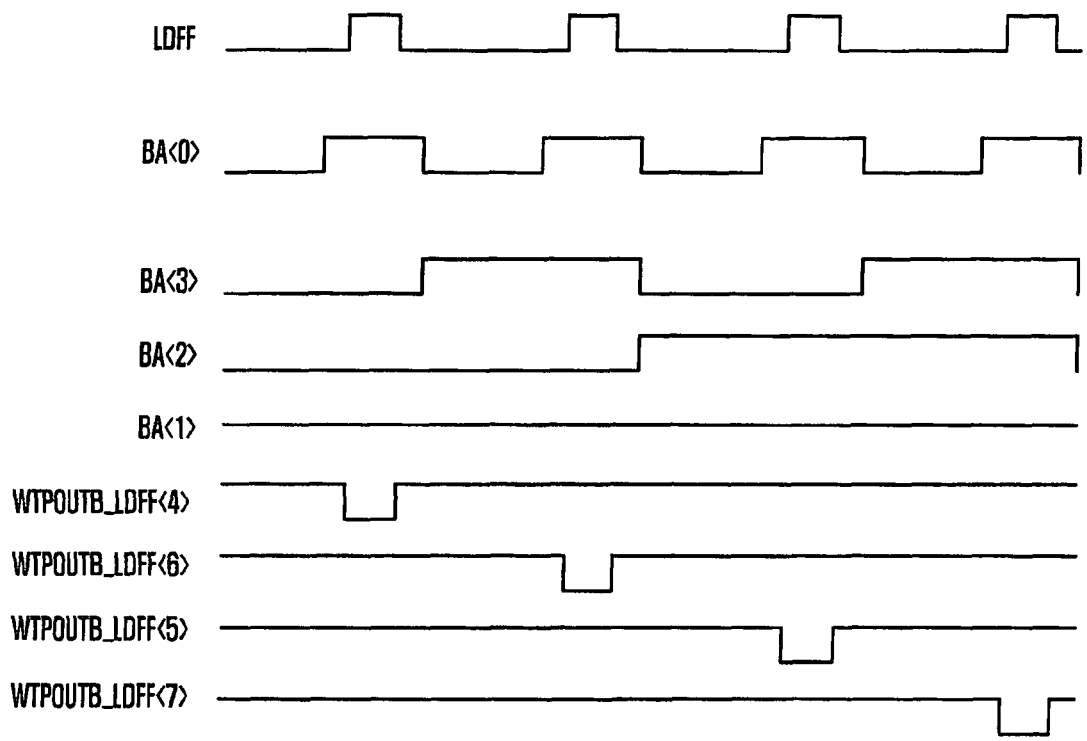
FIG. 10 is a timing diagram illustrating the operation of an address decoder circuit of FIG. 4.

FIG. 10 is a timing diagram illustrating the operation of the address decoder circuit ADDR_DEC1 of FIG. 4.

Referring to FIG. 10, the address decoder circuit ADDR_DEC1 including the plurality of address decoders activates one of the address decoding signals WTPOUTB_LDFF<0:7> in response to the control signal type address information BA<0:3> when the data loading signal LDFF is activated.

As described above, a time of maximum 144 tCK (=9 (CMD)×4(FIFO)×4(tCK)) must elapse until outputting the data training patterns applied to the data transfer circuits DQ0 to DQ31 and the data bus inversion circuits DBI0 to DBI3 included in all the data output circuits BYTE0 to BYTE3. However, the same data training patterns may be input to the plurality of data output circuits according to the operation environment for the read training. In this case, that is, when the same data training patterns are input to all the read FIFO buffers, a time of 48 tCK (=9(CMD)×1(FIFO)×4(tCK)+1 (CMD)×3(FIFO)×4(tCK)) is taken.

Figure 11:
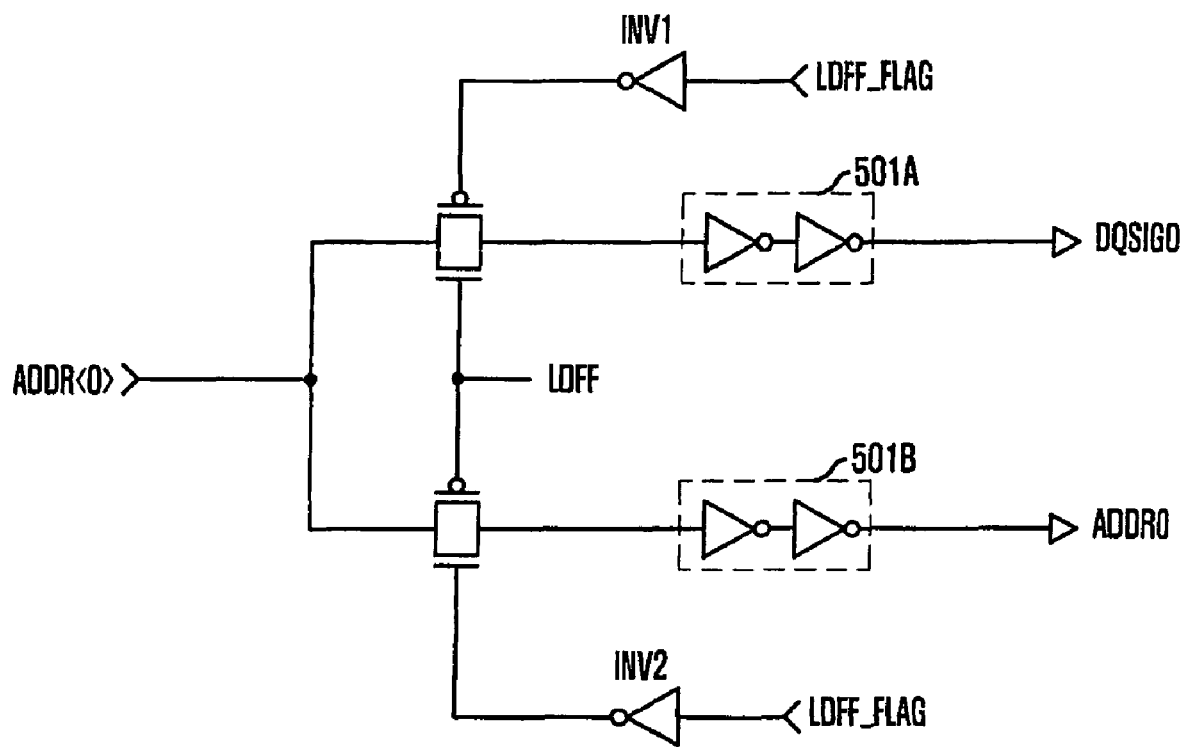
FIG. 11 is a circuit diagram of an unit driver included in training driver of FIG. 5.

FIG. 11 is a circuit diagram of an unit driver included in training driver 500 of FIG. 5. As shown in FIG. 11, the training driver 500 includes a plurality of unit drivers correspond to the number of source signals inputted through the upper and lower address pads ADDR_MSB and ADDR_LSB from an external. The unit driver receiving a first source signal ADDR<0> includes a first transmitting gate and a second transmitting gate for outputting the first source signal ADDR<0> to a first address information ADDR0 or data training pattern DQSIG0 in response to a inversed data loading flag signal LDFF_FLAG and a data loading signal LDFF. The unit driver further includes drivers for improving a drive ability of the unit drivers being connected with output ports of the first transmitting gate and the second transmitting gate. As above described, the unit driver outputs the first address information ADDR0 and the first data training pattern DQSIG0 in response to a first source signal ADDR<0>. The training driver 500 including a plurality of unit driver distributes the address information to generate a data training patterns.

As described above, the semiconductor memory device in accordance with the embodiment of the present invention can apply the data training patterns to the global input/output lines by distributing the address information according to the request of the external data processor, thereby outputting a variety of data training patterns. Therefore, the semiconductor memory device can perform the read training in a way similar to that of the actual read operation, and can improve the reliability of the data transfer between the data processor and the semiconductor memory device applied to the system in the normal operation.

In particular, since the data training patterns are programmed by distributing the external address information, the semiconductor memory device in accordance with the embodiment of the present invention can reduce the limitations of the training which may occur when the data training operation is performed by generating the fixed or limited data training patterns according to the previously stored operation or the preset operation. Furthermore, the semiconductor memory device in accordance with the embodiment of the present invention need not have a separate storage space because there is no information related to the data training pattern, which must be previously stored. Moreover, the efficient design of the semiconductor memory device can be achieved by adding simple circuits within the data output circuits.

In accordance with the embodiments of the present invention, the different data training patterns are output through the respective data pads by using the information input through the address pin together with the read training command applied from the data processor. Therefore, the semiconductor memory device can perform the read training in a way similar to the situation in which the data is output in the real semiconductor memory device.

Furthermore, the read training can be efficiently performed on all the data pads by using the information input through the address pin. Moreover, when the addresses about the data pads are input together with the read training command, the read training can be selectively performed on a part of the data pads.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device, comprising:
a plurality of address input circuits and a plurality of data output circuits; and
a training driver configured to distribute address information input through the plurality of address input circuits together with a data loading signal for a read training, and generate data training patterns to be output through the plurality of data output circuits,
wherein the address information comprises:
a data type address information for constructing the data training patterns; and
a control signal type address information for selecting one of the plurality of data output circuits to output the data type address information.

2. The semiconductor memory device as recited in claim 1, wherein each of the data output circuits comprises:
a write first-in first-out (FIFO) buffer unit configured to transfer the data type address information to a write global data line according to an address decoding signal activated in response to the control signal type address information;
a strobe signal generating unit configured to generate a strobe signal when the input of the address information corresponding to the data loading signal is completed; and
a read FIFO buffer unit configured to receive the data type address information transferred through the write global data line in response to the data loading signal and output the received data type address information in response to the strobe signal.

3. The semiconductor memory device as recited in claim 2, wherein the write FIFO buffer unit comprises:
a write FIFO buffer configured to transfer data applied from an external source in a write operation through the write global data line; and
a training FIFO buffer configured to transfer the data type address information to the write global data line according to the address decoding signal.

4. The semiconductor memory device as recited in claim 2, wherein the strobe signal generating unit comprises:
a logic unit configured to detect if the input of the address information corresponding to the data loading signal is completed;
a multiplexer configured to output one of an output of the first logic unit and a read strobe pulse in response to the data loading signal; and
a strobe generating unit configured to generate the strobe signal activated for a predetermined duration in response to an output of the first multiplexer.

5. The semiconductor memory device as recited in claim 2, wherein the read FIFO buffer unit comprises:
a multiplexer configured to output one of the write global data line and the read global data line in response to the data loading signal; and
a read FIFO buffer configured to output the data training patterns and data input from the multiplexer in response to the strobe signal.

6. The semiconductor memory device as recited in claim 2, further comprising a plurality of address decoders configured to output the address decoding signal selectively enabling the data output circuits to transfer the data type address information in response to the control signal type address information.

7. The semiconductor memory device as recited in claim 6, wherein each of the plurality of address decoders comprises:
a reset unit configured to disable the data output circuits in response to the data loading signal; and
an enable unit configured to enable the data output circuits corresponding to the control signal type address information.

8. The semiconductor memory device as recited in claim 7, wherein the enable unit comprises:
a plurality of MOS transistors serially connected to transfer a logic low level signal; and
a logic unit configured to enable the plurality of MOS transistors in response to only a preset control signal type address information.

9. The semiconductor memory device as recited in claim 7, wherein the reset unit comprises:
- a first MOS transistor configured to transfer a logic high level when the data loading signal is activated,
- a second MOS transistor configured to transfer an output of the enable unit when the data loading signal is activated; and
- a latch configured to hold output levels of the first and second MOS transistors and output the address decoding signal.

10. The semiconductor memory device as recited in claim 1, wherein the address information is input through the plurality of address input circuits at rising and falling edges of a system clock;
- the control signal type address information is input during a first period of the system clock in which the data loading signal is activated; and
- the data type address information is input during second and third periods of the system clock.

11. The semiconductor memory device as recited in claim 1, wherein the data training patterns are selectively output through one of all and a part of the plurality of data output circuits according to an operation environment for the read training.

12. The semiconductor memory device as recited in claim 1, wherein the plurality of address input circuits comprises eight address input circuits;
- the plurality of data output circuits comprises thirty-two data transfer circuits and four data bus inversion circuits;
- the read training is performed through the four data output circuits when the data loading signal is activated once; and
- the data training patterns are output through all the data output circuits when the data loading signal is activated nine times.

13. The semiconductor memory device as recited in claim 1, wherein the same data training patterns are input to the plurality of data output circuits according to an operation environment for the read training.

14. A method for operating a semiconductor memory device, the method comprising:
- generating data training patterns by distributing address information input through a plurality of address input circuits together with a data loading signal for a read training; and
- outputting the data training patterns through a plurality of data output circuits,
  - wherein the address information comprises:
    - a data type address information for constructing the data training patterns; and
    - a control signal type address information for selecting the data output circuits to output the data type address information.

15. The method as recited in claim 14, wherein the generating of the data training patterns comprises:
- decoding the control signal type address information;
- enabling data output circuits according to the decoding result; and
- outputting the data type address information as the data training patterns through the selected data output circuits.

16. The semiconductor memory device as recited in claim 1, wherein the training driver comprise a plurality of unit drivers, wherein the unit driver includes:
- a first transmitting gate for outputting the source signal from an external as the address information; and
- a second transmitting gate for outputting a source signal from an external as the data training patterns.

17. The semiconductor memory device as recited in claim 16, wherein the unit driver further includes a driver for improving a drive ability of the unit driver.

* * * * *